(12) United States Patent
Kasuya

(10) Patent No.: US 12,340,929 B2
(45) Date of Patent: Jun. 24, 2025

(54) COIL COMPONENT AND METHOD OF MANUFACTURING THE SAME

(71) Applicant: TAIYO YUDEN CO., LTD., Tokyo (JP)

(72) Inventor: Yuichi Kasuya, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 910 days.

(21) Appl. No.: 17/513,490

(22) Filed: Oct. 28, 2021

(65) Prior Publication Data

US 2022/0172874 A1    Jun. 2, 2022

(30) Foreign Application Priority Data

Nov. 30, 2020   (JP) ................................ 2020-198641

(51) Int. Cl.
     *H01F 27/24*      (2006.01)
     *H01F 27/32*      (2006.01)
     *H01F 41/04*      (2006.01)
     *H10D 1/20*      (2025.01)

(52) U.S. Cl.
     CPC ............ *H01F 27/24* (2013.01); *H01F 27/32* (2013.01); *H01F 41/04* (2013.01); *H10D 1/20* (2025.01)

(58) Field of Classification Search
     CPC .......... H01F 27/24; H01F 27/32; H01F 41/04; H10D 1/20
     See application file for complete search history.

(56) References Cited

U.S. PATENT DOCUMENTS

| | | | | |
|---|---|---|---|---|
| 2001/0038327 | A1* | 11/2001 | Aoki | H01F 27/027 336/83 |
| 2008/0252406 | A1* | 10/2008 | Kitajima | H01F 17/045 336/83 |
| 2008/0309443 | A1* | 12/2008 | Furuya | H01F 41/127 336/83 |
| 2010/0321144 | A1* | 12/2010 | Kudo | H01F 17/045 336/192 |
| 2019/0287712 | A1* | 9/2019 | Ishida | H01F 1/143 |

FOREIGN PATENT DOCUMENTS

| | | | |
|---|---|---|---|
| JP | S5944013 U | * | 3/1984 |
| JP | 2010-187006 A | | 8/2010 |

* cited by examiner

*Primary Examiner* — Malcolm Barnes
(74) *Attorney, Agent, or Firm* — Pillsbury Winthrop Shaw Pittman, LLP

(57) ABSTRACT

A coil component according to one or more embodiments of the present invention includes: a drum core; a conductive wire; external electrodes; and an exterior portion made of a resin material. The drum core includes a winding core portion, a first flange portion provided at one end of the winding core portion, and a second flange portion provided at the other end of the winding core portion. The conductive wire includes a wound portion wound around the winding core portion and a first lead-out portion and a second lead-out portion led out from the winding core portion to the first flange portion. The pair of external electrodes are provided at the first flange portion, and each of the external electrodes is electrically connected to associated one of end portions of the conductive wire. The exterior portion includes a first exterior portion and a second exterior portion.

13 Claims, 8 Drawing Sheets

COIL COMPONENT AND METHOD OF MANUFACTURING THE SAME

CROSS-REFERENCE TO RELATED APPLICATIONS

This application is based on and claims the benefit of priority from Japanese Patent Application Serial No. 2020-198641 (filed on Nov. 30, 2020), the contents of which are hereby incorporated by reference in their entirety.

TECHNICAL FIELD

The present disclosure relates to a coil component and a method of manufacturing the coil component.

BACKGROUND

In the related art, a conductive wire-type coil component is known. The conductive wire-type coil component includes a drum core and a conductive wire wound around the drum core. The drum core includes, for example, a pair of flanges and a winding core coupling the pair of flanges, and the conductive wire is wound around the winding core. An exterior portion is formed between the pair of flanges to cover the conductive wire wound around the winding core. Such a conductive wire-type coil component is disclosed in Japanese Patent Application Laid-Open No. 2010-187006, for example.

In the coil component in the related art, defects such as voids and/or open pores or the like may be formed in an exterior portion due to air remaining in a gap of the conductive wire when the exterior portion is formed. If such defects are formed, there is a probability that a flux used in a case in which the conductive wire is solder-bonded when an external electrode of the coil component is formed and a flux used when the coil component is mounted on a circuit board enter the exterior portion through the defects and come into contact with the conductive wire, and the flux entering the inside causes short-circuiting or degradation of properties of the coil component.

SUMMARY

One object of the present invention is to provide a coil component capable of curbing entrance of a flux and a method of manufacturing the coil component. Other objects of the present invention will become obvious through description in the entire specification.

A coil component according to one aspect of the present invention includes: a drum core including a winding core portion, a first flange portion provided at one end of the winding core portion, and a second flange portion provided at the other end of the winding core portion; a conductive wire including a wound portion wound around the winding core portion and a first lead-out portion and a second lead-out portion led out from the winding core portion to the first flange portion; a pair of external electrodes provided at the first flange portion, each external electrode of the pair of external electrodes being electrically connected to associated one of end portions of the conductive wire; and an exterior portion including a first exterior portion and a second exterior portion and made of a resin material, the first exterior portion being provided to cover a region in a surface of the first flange portion facing the second flange portion and expose a part of the wound portion, the region being surrounded by the first lead-out portion, the second lead-out portion, the wound portion, and one side of the first flange portion to which the first lead-out portion and the second lead-out portion are led out when seen from an axial direction of the winding core portion, the second exterior portion covering at least a part of the first exterior portion and the part of the wound portion exposed from the first exterior portion.

In the one aspect of the present invention, the first exterior portion and the second exterior portion may be made of a resin material containing a same component.

In the one aspect of the present invention, the conductive wire and the external electrodes may be electrically connected through solder-bonding.

In the one aspect of the present invention, a volume of the first exterior portion may be smaller than a volume of the second exterior portion.

In the one aspect of the present invention, a volume of the first exterior portion may be larger than a volume of the second exterior portion.

In the one aspect of the present invention, the resin material may include a filler made of a magnetic material.

In the one aspect of the present invention, the magnetic material may be a metal or a ferrite.

In the one aspect of the present invention, the first exterior portion may include no voids.

One aspect of the present invention relates to a circuit board including any one of the above coil components. One aspect of the present invention relates to an electronic device comprising the above circuit board.

A method of manufacturing a coil component according to one aspect of the present invention includes: preparing a drum core including a winding core portion, a first flange portion provided at one end of the winding core portion, and a second flange portion provided at the other end of the winding core portion; winding a conductive wire around the drum core to form a wound portion wound around the winding core portion and a first lead-out portion and a second lead-out portion led out from the winding core portion to the first flange portion; bonding and securing both end portions of the conductive wire to the first flange portion to form a pair of external electrodes; and forming an exterior portion covering the wound portion of the conductive wire using a resin material, and the forming of the exterior portion includes forming a first exterior portion to cover a region in a surface of the first flange portion facing the second flange portion and expose a part of the wound portion, the region being surrounded by the first lead-out portion, the second lead-out portion, the wound portion, and one side of the first flange portion to which the first lead-out portion and the second lead-out portion are led out when seen from an axial direction of the winding core portion, and forming a second exterior portion that covers at least a part of the first exterior portion and the part of the wound portion exposed from the first exterior portion.

In the one aspect of the present invention, the forming of the first exterior portion may include a first heating process of curing the resin material, the forming of the second exterior portion may include a second heating process of curing the resin material, and a temperature may be raised at a lower rate in the second heating process than in the first heating process.

In the one aspect of the present invention, a viscosity of the resin material constituting the first exterior portion may be lower than a viscosity of the resin material constituting the second exterior portion.

According to the present invention, the coil component capable of curbing entrance of a flux and the method of manufacturing the coil component are provided.

DESCRIPTION OF THE PREFERRED EMBODIMENTS

Various embodiments of the present invention will be hereinafter described with reference to the accompanying drawings. The constituents common to more than one drawing are denoted by the same reference signs throughout the drawings. Note that for convenience of explanation, the drawings are not necessarily drawn to scale.

Figure 1:
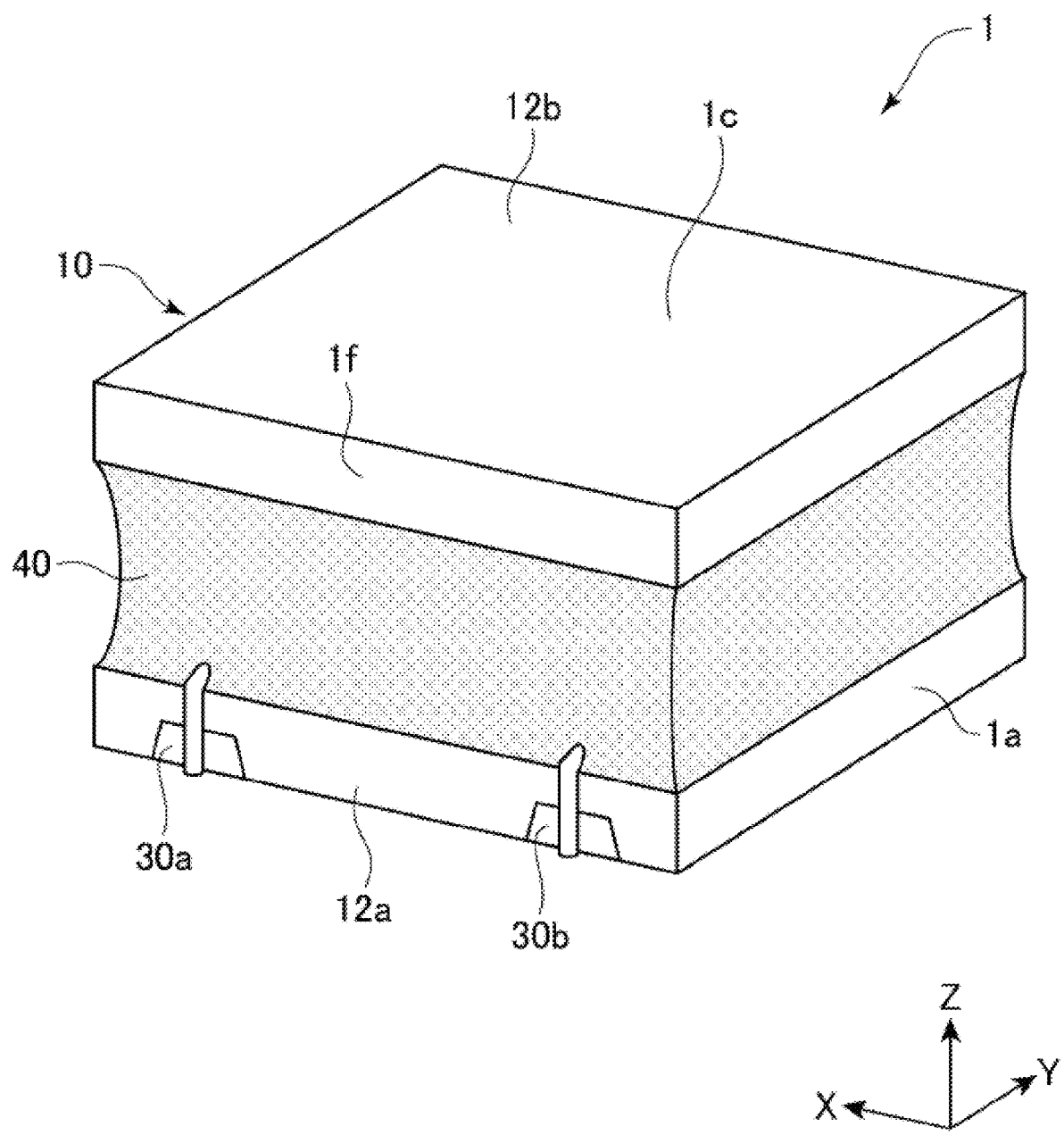
FIG. 1 is a perspective view schematically showing a coil component according to one embodiment of the present invention.
Figure 2:
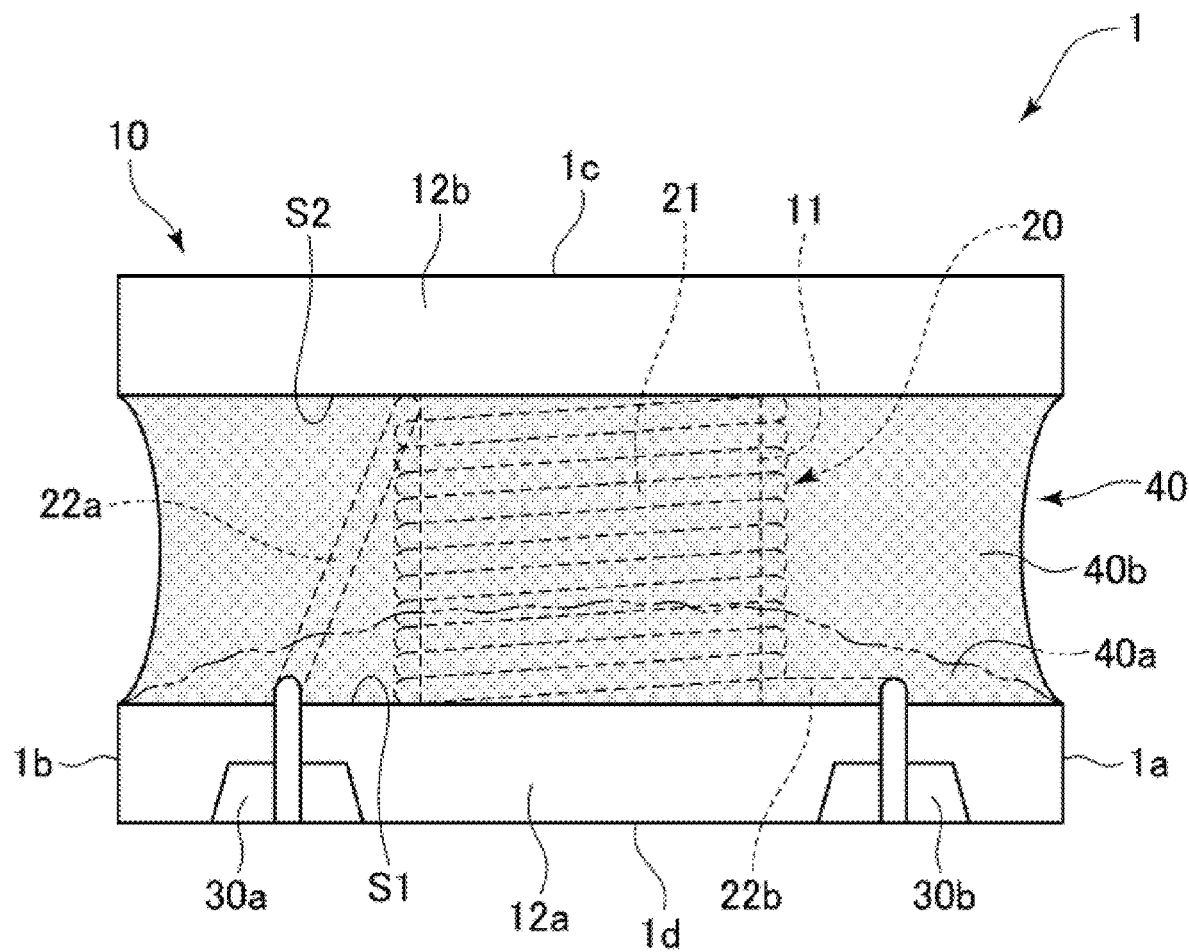
FIG. 2 is a front view of the coil component of FIG. 1.
Figure 3:
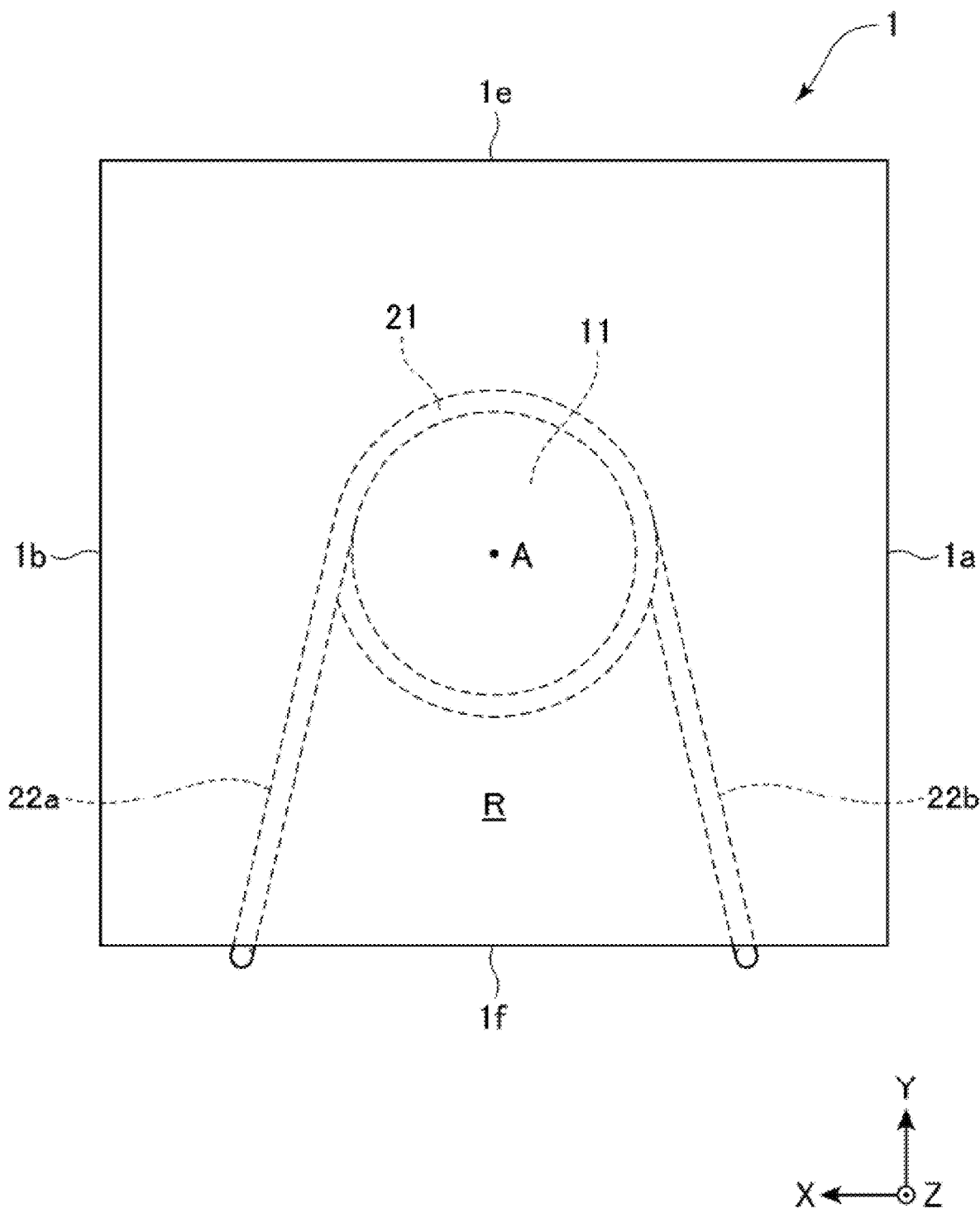
FIG. 3 is a top view of the coil component of FIG. 1.

FIG. 1 is a perspective view illustrating a coil component according to one embodiment of the present invention. FIG. 2 is a front view of the coil component of FIG. 1. FIG. 3 is a top view of the coil component of FIG. 1. As illustrated in the drawings, a coil component 1 according to one embodiment of the present invention includes a drum core 10, a conductive wire 20, external electrodes 30a and 30b, and an exterior portion 40. The drum core 10 includes a winding core 11, a first flange portion 12a, and a second flange portion 12b. The coil component 1 is, for example, an inductor used to eliminate noise in an electronic circuit. The coil component 1 may be a power inductor built in a power supply line or an inductor used in a signal line.

The coil component 1 is mounted on a circuit board by each of the external electrodes 30a and 30b being electrically connected to land portions provided on the circuit board (not illustrated). The circuit board can be mounted in a variety of electronic devices. The electronic devices including the circuit board on which the coil component 1 is mounted include a smartphone, a mobile phone, a tablet terminal, a game console, an electronic device for a vehicle, and other arbitrary electronic devices that can include the circuit board on which the coil component 1 is mounted.

In FIGS. 1 to 3, an X direction, a Y direction, and a Z direction that intersect one another are illustrated. The "length" direction, the "width" direction, and the "thickness" direction of the coil component 1 are assumed to correspond to the "X-axis" direction, the "Y-axis" direction, and the "Z-axis" direction in FIG. 1, respectively, unless the context indicates otherwise. In the specification, orientations and arrangement of components of the coil component 1 may be described with reference to the X direction, the Y direction, and the Z direction illustrated in FIG. 1. Specifically, the direction in which an axial core A of the winding core portion 11 extends is defined as the Z direction, and one of the directions that are perpendicular to the axial core A of the winding core portion 11 and are parallel to the plane in which the external electrodes 30a and 30b are provided is defined as the X direction. Also, the direction that perpendicularly intersects the X direction and the Z direction is defined as the Y direction.

The coil component 1 according to one embodiment of the present invention includes a first end surface 1a, a second end surface 1b, a first principal surface 1c (upper surface 1c), a second principal surface 1d (bottom surface 1d), a first side surface 1e, and a second side surface 1f. More specifically, the first end surface 1a is an end surface of the coil component 1 in the negative direction of the X axis, the second end surface 1b is an end surface of the coil component 1 in the positive direction of the X direction, the first principal surface 1c is an end surface of the coil component 1 in the positive direction of the Z axis, the second principal surface 1d is an end surface of the coil component 1 in the negative direction of the Z axis, the first side surface 1e is a side surface of the coil component 1 in the positive direction of the Y axis, and the second side surface 1f is a side surface of the coil component 1 in the negative direction of the Y axis. Each of the first end surface 1a, the second end surface 1b, the first side surface 1e, and the second side surface 1f is configured with a part of the drum core 10 and a part of the exterior portion 40.

The coil component 1 according to one embodiment of the present invention is formed into a rectangular parallelepiped shape. The coil component 1 according to one embodiment of the present invention may be formed into a shape other than the rectangular parallelepiped shape. The coil component 1 can have various shapes such as a cylindrical shape, a hexagonal columnar shape, or an octagonal columnar shape, for example. The first principal surface 1c and the second principal surface 1d of the coil component 1 can have arbitrary shapes, and the coil component 1 has one or more surfaces coupling the first principal surface 1c to the second principal surface 1d in accordance with the shapes of the first principal surface 1c and the second principal surface 1d. In a case in which the coil component 1 is formed into a rectangular parallelepiped shape, both the first principal surface 1c and the second principal surface 1d have a rectangular or square shape, and four side surfaces coupling therebetween corresponds to the first end surface 1a, the second end surface 1b, the first side surface 1e, and the second side surface 1f. Each of the first end surface 1a, the second end surface 1b, the first principal surface 1c, the second principal surface 1d, the first side surface 1e, and the second side surface 1f of the coil component 1 may be a flat surface or a curved surface. Also, corner portions of each of the surfaces of the coil component 1 may be rounded or have notches.

As described above, a shape in which a part of the first end surface 1a, the second end surface 1b, the first principal surface 1c, the second principal surface 1d, the first side surface 1e, and the second side surface 1f of the coil component 1 is curved or a shape in which corners of the coil component 1 are rounded may also be referred to as a "rectangular parallelepiped shape" in the specification. That is, a "rectangular parallelepiped" or a "rectangular parallelepiped shape" described herein is not intended to mean a "rectangular parallelepiped" in a mathematically strict sense. Although the case in which the coil component 1 has a "rectangular parallelepiped shape" will be described below as an example in description of the present invention, the description can be incorporated in consideration of differences in shapes other than the rectangular parallelepiped shape as well.

The drum core 10 includes a winding core portion 11, the first flange portion 12a provided at one end of the winding core portion 11 in the direction of the axial core A, and the second flange portion 12b provided at the other end of the winding core portion 11 in the direction of the axial core A. The winding core portion 11 couples the first flange portion 12a to the second flange portion 12b. The first flange portion 12a and the second flange portion 12b are disposed such that inner surfaces thereof face each other. Both an outer surface of the first flange portion 12a disposed to face an inner surface S1 of the first flange portion 12a and an outer surface of the second flange portion 12b disposed to face an inner surface S2 of the second flange portion 12b constitute a part of outer surfaces of the coil component 1. In the illustrated embodiment, the outer surface of the first flange portion 12a is the second principal surface (that is, the bottom surface) 1d of the coil component 1 while the outer surface of the second flange portion 12b is the first principal surface (that is, the upper surface) 1a of the coil component 1. All the inner and outer surfaces of the first flange portion 12a and the second flange portion 12b and side surfaces connecting the inner and outer surfaces may be flat planes or curved surfaces. Also, each of corners of the first flange portion 12a and the second flange portion 12b may be rounded or have a notch. The first flange portion 12a and the second flange portion 12b may have the same shape or mutually different shapes. In a case in which the first flange portion 12a and the second flange portion 12b do not have the same shape, an end surface 1a of the end surface of the first flange portion 12a, in which the external electrodes are formed, in the negative direction of the X axis is caused to serve as the first end surface 10a of the core 10, an end surface 1b of the end surface 1a of the first flange portion 12a in the positive direction of the X axis is caused to serve as the second end surface 10b of the core 10, an side surface 1e of a side surface of the first flange portion 12a in the positive direction of the Y axis is caused to serve as the first side surface 10e of the core 10, and a side surface 1f of a side surface of the first flange portion 12a in the negative direction of the Y axis is caused to serve as the second side surface 10f.

In the illustrated embodiment, the first flange portion 12a and the second flange portion 12b are configured such that the inner surfaces S1 and S2 and the outer surfaces thereof extend in the direction that is perpendicular to the axial core A of the winding core portion 11. When the terms "perpendicular", "orthogonal", and "parallel" are used in the specification, the terms are not used in mathematically strict meanings. In a case in which the inner surface S1 of the first flange portion 12a extends in the direction that is perpendicular to the axial core A of the winding core 11, for example, the angle formed between the outer surface of the first flange portion 12a and the axial core A of the winding core 11 may be 90° or about 90°. The angular range of about 90° can include an arbitrary angular range of 70° to 110°, 75° to 105°, 80° to 100°, or 85° to 95°. Likewise, the terms "parallel", "orthogonal", and other words that are included in this specification and can be interpreted in a mathematically strict meaning are also susceptible of wider interpretation than the mathematically strict meanings thereof in light of the purport and context of the present invention and the technical common knowledge.

The drum core 10 is made of a magnetic material or a non-magnetic material. The magnetic material used for the drum core 10 is, for example, ferrite or a soft magnetic alloy material. The non-magnetic material used for the drum core 10 is, for example, alumina or glass. The magnetic material used for the drum core 10 may be various crystalline or amorphous magnetic alloy materials, or a combination of a crystalline material and an amorphous material. The crystalline magnetic alloy material used as a magnetic material for the drum core 10 is composed mainly of Fe for example, and contains one or more elements selected from the group consisting of Si, Al, Cr, Ni, Ti, and Zr. The amorphous magnetic alloy material used as a magnetic material for the drum core 10 contains, for example, B or C, in addition to any one of Si, Al, Cr, Ni, Ti, and Zr. The magnetic material used for the drum core 10 may be a pure iron composed of Fe and inevitable impurities. The magnetic material used for the drum core 10 may be a combination of the pure iron composed of Fe and inevitable impurities and various crystalline or amorphous magnetic alloy materials. For example, Ni—Zn ferrite may be used to improve the insulation quality. In particular, use of Ni—Zn ferrite ensures the insulation quality between external electrodes, making it possible to reduce the distance between the external electrodes and thus downsize the coil component 1. The materials of the drum core 10 are not limited to those explicitly named herein, and any material known as a material for a drum core can be used.

For the drum core 10, powder of the magnetic material or the non-magnetic material described above is mixed with a resin (binder) first, for example. In addition to the binder, a lubricant, a mold release agent, and other auxiliary components may be mixed. Next, a cavity of a mold die is filled with the mixed materials, press molding is performed thereon to produce a powder compact, and the powder compact is sintered, thereby producing the drum core 10. Further, the drum core 10 can also be produced by mixing the powder of the magnetic material or the non-magnetic material described above with a resin, a glass, or an insulating oxide (e.g., Ni—Zn ferrite or silica), molding the mixed material, and hardening or sintering the mixed material.

The conductive wire 20 is wound around the winding core 11. The conductive wire 20 is configured by covering, with an insulating coating, the surroundings of a conductive wire made of a metal material with excellent conductivity. As the metal material constituting the conductive wire 20, one or more kinds of metal out of Cu (copper), Al (aluminum), Ni (nickel), or Ag (silver) or an alloy containing any of these kinds of metal can be used, for example.

The conductive wire 20 includes a wound portion 21 wound around the winding core portion 11 and a first lead-out portion 22a and a second lead-out portion 22b led out from the winding core portion 11 to the first flange portion 12a. The wound portion 21 is a portion wound around the winding core portion 11 with the axial core A located at the center, and the first lead-out portion 22a and the second lead-out portion 22b are portions corresponding to both ends of the wound portion 21 linearly extending toward the external electrodes 30a and 30b provided at the first flange portion 12a. The wound portion 21 can have an arbitrary shape in accordance with the shape of the winding core portion 11 when seen from the direction of the axial core A. For example, the wound portion 21 is a portion wound in a circular shape in a case in which the winding core portion 11 has a circular shape when seen from the direction of the axial core A, or the wound portion 21 is a portion wound in a rectangular shape in a case in which the winding core portion 11 has a rectangular shape when seen from the direction of the axial core A. The wound portion 21 may be wound in a polygonal shape when seen from the direction of the axial core A. More specifically, the first lead-out portion 22a is led out from a side of the wound portion 21 on a side closer to the second flange portion 12b toward the external electrode 30a, and the second lead-out portion 22b is led out from a side of the wound portion 21 on a side closer to the first flange portion 12a toward the external electrode 30b. End portions of the first lead-out portion 22a and the second lead-out portion 22b are electrically connected to the external electrode 30a and the external electrode 30b, respectively. Although only one layer of the conductive wire 20 is wound around the winding core portion 11 in the illustrated embodiment, a plurality of layers of the conductive wire 20 may be wound around the winding core portion 11.

One of the first flange portion 12a and the second flange portion 12b is provided with the external electrodes 30a and 30b. In the illustrated embodiment, the first flange portion 12a is provided with the external electrodes 30a and 30b. More specifically, each of the external electrodes 30a and 30b is provided to extend from the side surface of the first flange portion 12a in the negative direction of the Y axis (that is, the second side surface 10f of the drum core 10) to the outer surface of the first flange portion 12a (that is, the first principal surface 10c of the drum core 10) and to be separated from each other in the X-axis direction, the external electrode 30a is provided on the positive direction side of the X axis, and the external electrode 30b is provided on the negative direction side of the X axis. Each of the external electrodes 30a and 30b may extend up to the side surface in the positive direction of the Y axis (that is, the first side surface 10e of the drum core 10). The shape and the arrangement of the external electrode 30a and the external electrode 30b shown are merely illustrative, and the external electrode 30a and the external electrode 30b can be variously shaped and arranged.

The exterior portion 40 is formed by filling a portion between the first flange portion 12a and the second flange portion 12b with a resin. The exterior portion 40 can include a filler, for example. The filler included in the exterior portion 40 may be a magnetic material. The exterior portion 40 is formed to cover the wound portion 21 of the conductive wire 20. As the resin material constituting the exterior portion 40, a thermosetting resin with excellent insulating properties can be used, for example. More specifically, it is possible to use, for example, an epoxy resin, a polyimide resin, a polystyrene (PS) resin, a high-density polyethylene (HDPE) resin, a polyoxymethylene (POM) resin, a polycarbonate (PC) resin, a polyvinylidene fluoride (PVDF) resin, a phenolic resin, a polytetrafluoroethylene (PTFE) resin, a polybenzoxazole (PBO) resin, or other arbitrary known resin materials used to cover a conductive wire of a conductive wire-type coil component. As the filer of the magnetic material, ferrite powder, metal magnetic particles, a soft magnetic metal alloy, and the like can be used. The exterior portion 40 may further include a filler of a non-magnetic material in addition to the filler of the magnetic material. As the filler of the non-magnetic material, silica particles, for example, can be used.

As illustrated in FIG. 2, the exterior portion 40 includes a first exterior portion 40a and a second exterior portion 40b. The first exterior portion 40a is provided to cover at least a region R (see FIG. 3) in a surface of the first flange portion 12a facing the second flange portion 12b (that is, the inner surface 51 of the first flange portion 12a) and expose a part of the wound portion 21 from the first exterior portion 40a. The region R is surrounded by the first lead-out portion 22a, the second lead-out portion 22b, the wound portion 21, and one side of the first flange portion 12a to which the first lead-out portion 22a and the second lead-out portion 22b are led out when seen from the direction of the axial core A of the winding core portion 11. The second exterior portion 40b is provided to cover at least a part of the first exterior portion 40a and the part of the wound portion 21 exposed from the first exterior portion 40a. In the illustrated embodiment, the first exterior portion 40a is provided to cover the entire inner surface S1 of the first flange portion 12a, the portion between the upper surface of the first exterior portion 40a (that is, the surface in the positive direction of the Z axis) and the inner surface S2 of the second flange portion 12b is filled with the second exterior portion 40b. It is only necessary for the wound portion 21 to be partially exposed from the first exterior portion 40a as long as the region R of the inner surface S1 of the first flange portion 12a is covered with the first exterior portion 40a, and the amount of the wound portion 21 exposed from the first exterior portion 40a is not particularly limited. Although the volume of the first exterior portion 40a is smaller than the volume of the second exterior portion 40b in the illustrated embodiment, the volume of the first exterior portion 40a may be larger than the volume of the second exterior portion 40b.

The first exterior portion 40a and the second exterior portion 40b of the exterior portion 40 may be made of a resin material of the same component or may be made of resin materials of mutually different components. It is possible to prevent electrical properties of the coil component 1 from varying due to the exterior portion 40 by forming the first exterior portion 40a and the second exterior portion 40b using the resin material of the same component. Also, it is possible to cause linear expansion coefficients of the first exterior portion 40a and the second exterior portion 40b to conform to each other by forming the first exterior portion 40a and the second exterior portion 40b using the resin material of the same component. Moreover, it is possible to enhance adhesiveness between interferences of both the first exterior portion 40a and the second exterior portion 40b by forming the first exterior portion 40a and the second exterior portion 40b using the resin material of the same component. In a case in which the first exterior portion 40a and the second exterior portion 40b are made of resin materials of mutually different components, the viscosity of the resin material constituting the first exterior portion 40a is preferably lower than the viscosity of the resin material constituting the second exterior portion 40b. In one example, the viscosity of the resin material constituting the first exterior portion 40a can be 0.5 times to 1 time as high as the viscosity of the resin material constituting the second exterior portion 40b. The viscosity is a value measured by a B-type viscometer at 25° C. For example, the viscosity of the material used for the first exterior portion can be measured as 15 Pa S by a Brookfield B-type viscometer. Also, the viscosity of the material used for the second exterior portion can be measured as 20 Pa S in similar measurement.

Figure 4:
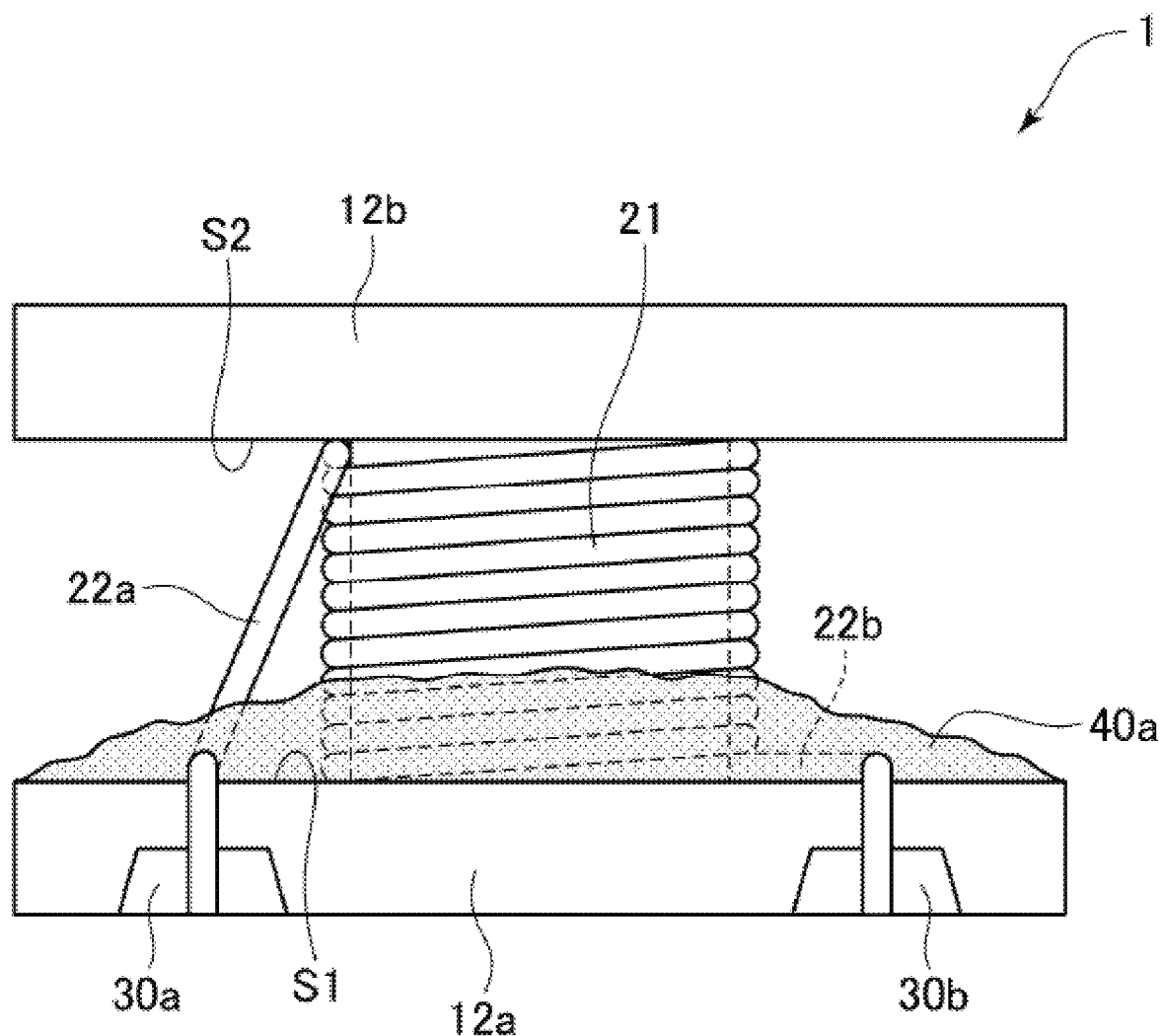
FIG. 4 is a diagram for explaining a method of manufacturing the coil component of FIG. 1.

Next, a method of manufacturing the coil component 1 according to one embodiment of the present invention will be described with reference to FIGS. 4 and 2. FIG. 4 is a schematic view for explaining a method of manufacturing the coil component 1.

First, the drum core 10 including the winding core portion 11, the first flange portion 12a provided at the one end of the winding core portion 11, and the second flange portion 12b provided at the other end of the winding core portion 11 is prepared. The drum core 10 is produced by mixing the aforementioned soft magnetic metal particles, for example, with a thermosetting resin to form a mixture and thermally curing the mixture. Also, the drum core 10 may be a so-called powder compact core. The powder compact core may be produced by mixing the aforementioned soft magnetic metal particles with a resin (binder) to form a granulated substance, press-molding the granulated substance using a mold die to produce a powder compact, and thermally treating the powder compact. The molded article after the curing or the heat treatment can be subjected to cutting as needed. Grooves for forming the external electrodes 30a and 30b in the second principal surface 1d (bottom surface 1d) of the core 10 can also be formed as illustrated in the drawing through cutting. The grooves for forming the external electrodes 30a and 30b can also be produced at the time of molding. The grooves for forming the external electrodes 30a and 30b may not be provided.

Next, the external electrodes 30a and 30b are formed in the surface of the drum core 10. The external electrodes 30a and 30b can be formed by causing a single layer or a plurality of layers of conductive paste including metal particles of silver, copper, nickel, tin, or the like to adhere to the second principal surface 1d (bottom surface 1d) of the first flange portion 12a through rubber transfer, for example, and drying the paste. Also, the external electrodes 30a and 30b can be formed by various known methods such as dipping, brush painting, printing, a thin film process, metal plate attachment, and metal tape attachment as well as the transfer.

Next, the conductive wire 20 is wound around the winding core portion 11 a predetermined number of times. One end portion of the conductive wire 20 is thermally press-fitted to the external electrode 30a, and the other end portion of the conductive wire 20 is thermally press-fitted to the external electrode 30b. The one end and the other end of the conductive wire 20 can be secured to the external electrodes 30a and 30b, respectively, by various known methods as well as the thermal press-fitting. For example, the conductive wire 20 can be secured to each of the external electrodes 30a and 30b by solder-bonding, metal brazing, adhesion with a heat-resistant adhesive, pinching with metal plates, or a combination thereof. When the conductive wire 20 is bonded to the external electrodes 30a and 30b, a flux may be used to activate a metal surface and stabilize the bonding. It is possible to activate a bonding surface between the conductive wire 20 and the external electrodes 30a and 30b and to facilitate the bonding through the utilization of the flux. In a case in which groove parts are formed in the second principal surface 1d (bottom surface 1d) of the first flange portion 12a, the end portions of the conductive wire 20 are secured to the inside of the grooves. It is possible to secure the end portions of the conductive wire 20 to the inside of the grooves by immersing the surroundings of the end portions of the conductive wire 20 disposed inside the grooves formed in the bottom surface 1d into a solder, for example. Also, it is possible to secure the end portions of the conductive wire 20 to the inside of the grooves by molding solder members with a shape that is complementary with the grooves formed in the bottom surface 1d in advance, fitting the solder members into the grooves inside which the end portions of the conductive wire 20 are disposed, and melting the solder members fitted into the grooves with heat. The solders securing the conductive wire 20 may be formed to fill the entire grooves. The solder may be formed to project in the negative direction of the Z axis from the second principal surface 1d (bottom surface 1d) of the first flange portion 12a. It is desirable that the solder used be a so-called lead-free solder that does not contain lead and contains Sn as a main constituent rather than a solder in the related art including a lead/tin alloy. A flux is used to activate the metal surface and stabilize the bonding for the bonding in this case as well. It is possible to easily perform the bonding between the conductive wire 20 and the external electrodes 30a and 30b and to fixedly secure the conductive wire 20 through the utilization of the flux. Also, it is possible to bond the coil component 1 to the circuit board with a sufficient amount of solder when the coil component 1 is mounted on the circuit board and thereby to improve mounting strength of the coil component 1. Through the process, each of the wound portion 21, the first lead-out portion 22a, and the second lead-out portion 22b of the conductive wire 20 is formed, and the first lead-out portion 22a and the second lead-out portion 22b are electrically connected to the external electrodes 30a and 30b, respectively.

Next, the exterior portion 40 covering the wound portion 21 of the conductive wire 20 is formed using a resin material. In the process of forming the exterior portion 40, a resin paste is applied first, is then heated to cure the resin paste, thereby forming the first exterior portion 40a as illustrated in FIG. 4. The resin paste can include, for example, an uncured thermosetting resin, a filler, a dispersant, a viscosity adjusting agent, and the like. The resin paste constituting the first exterior portion 40a may include a filler made of a magnetic material. When the resin paste is applied to form the first exterior portion 40a, the region R (see FIG. 3) surrounded by the first lead-out portion 22a, the resin paste is applied to cover the second lead-out portion 22b, the one side of the first flange portion 12a to which the first lead-out portion 22a and the second lead-out portion 22b are led out, and the wound portion 21 when seen in the direction of the axial core A of the winding core portion 11 in the surface of the first flange portion 12a facing the second flange portion 12b (that is, at least the inner surface S1 of the first flange portion 12a) with a part of the wound portion 21 exposed. The process of heating the resin paste constituting the first exterior portion 40a (first heating process) is performed by raising the temperature from the room temperature to 140° C. for five minutes and then keeping the temperature at 140° C. to 180° C. for five minutes, for example.

Figure 5:
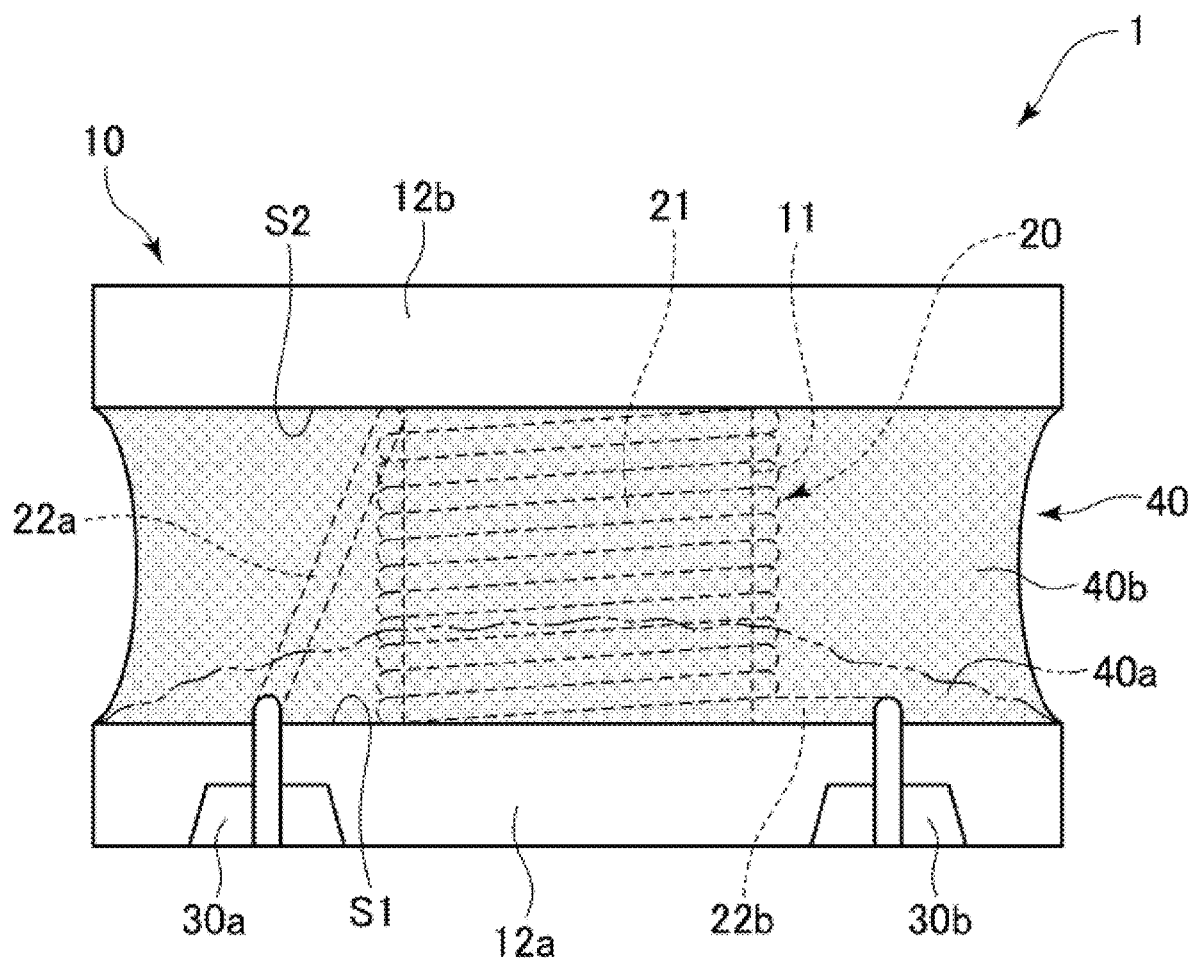
FIG. 5 is a diagram for explaining the method of manufacturing the coil component of FIG. 1.

Next, the resin paste is applied again, is heated, and is cured, thereby forming the second exterior portion 40b as illustrated in FIG. 5. When the resin paste is applied to form the second exterior portion 40b, the resin paste is applied to cover at least a part of the first exterior portion 40a and the wound portion 21 exposed from the first exterior portion 40a. The resin paste constituting the second exterior portion 40b may include a filler made of a magnetic material. The process of heating the resin paste constituting the second exterior portion 40b (second heating process) is performed for a longer time at a lower temperature raising rate as compared with the process of heating the resin paste constituting the first exterior portion 40a (first heating process). For example, the second heating process is performed by raising the temperature from the room temperature to 100° C. four sixty minutes or more and then keeping the temperature at 150° C. to 180° C. for thirty minutes.

Figure 6:
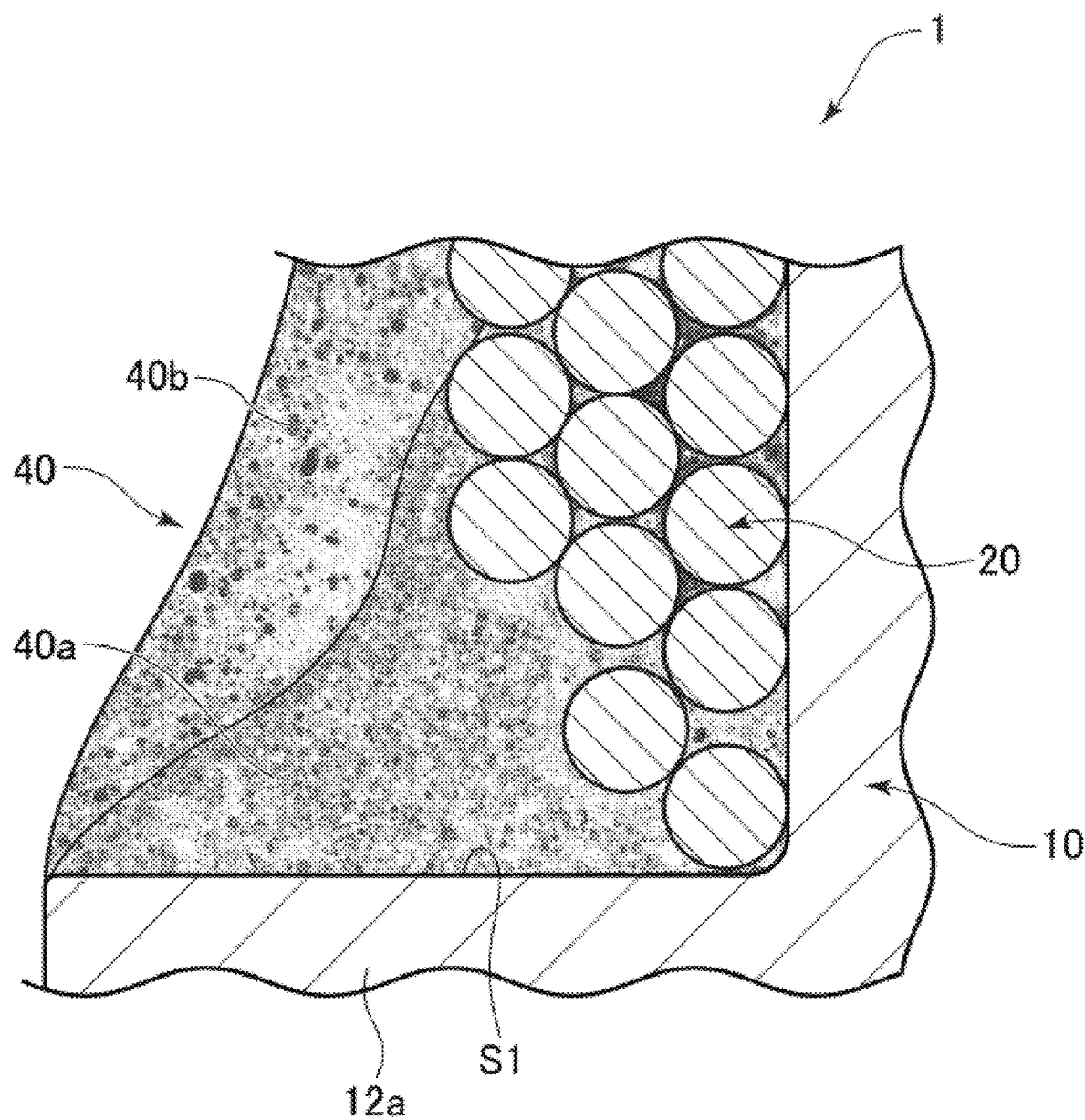
FIG. 6 is a schematic view of a section near a first flange portion of the coil component.

Next, a part of the first flange portion 12a, the second flange portion 12b, and/or the exterior portion 40 are subjected to polishing as needed. The coil component 1 is produced through the aforementioned processes. FIG. 6 is a schematic view of a microscope image obtained by polishing a section of the coil component produced by the aforementioned method near the first flange portion 12a and observing the section with an optical microscope at a magnification of 100 times to 1500 times. As illustrated in FIG. 6, it is possible to recognize that the exterior portion 40 of the coil component 1 includes the first exterior portion 40a and the second exterior portion 40b, the first exterior portion 40a covers the inner surface S1 of the first flange portion 12a, and a part of the wound portion 21 of the conductive wire 20 is exposed from the first exterior portion 40a.

Figure 7:
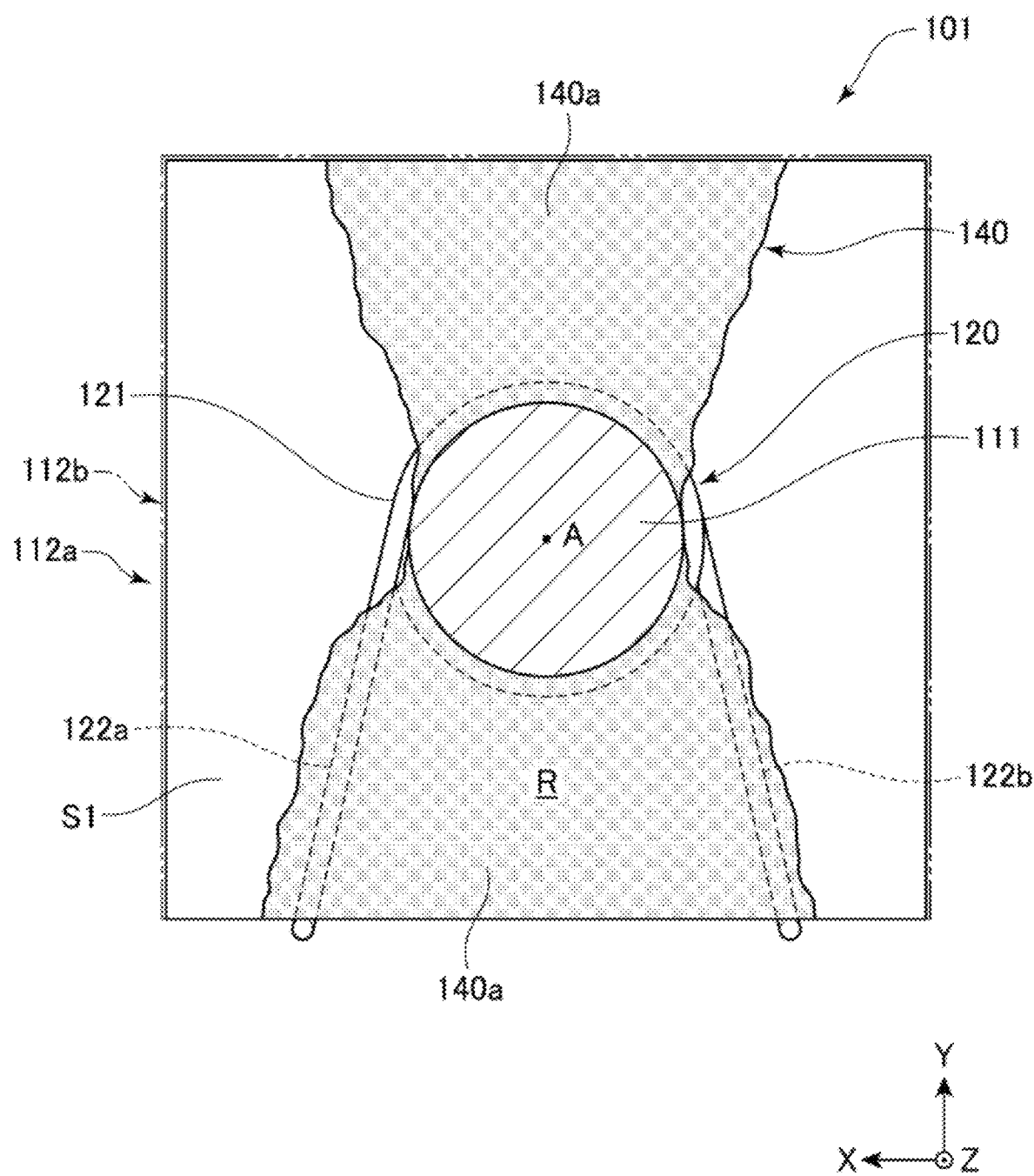
FIG. 7 is a top view for explaining a method of manufacturing a coil component according to a different embodiment.
Figure 8:
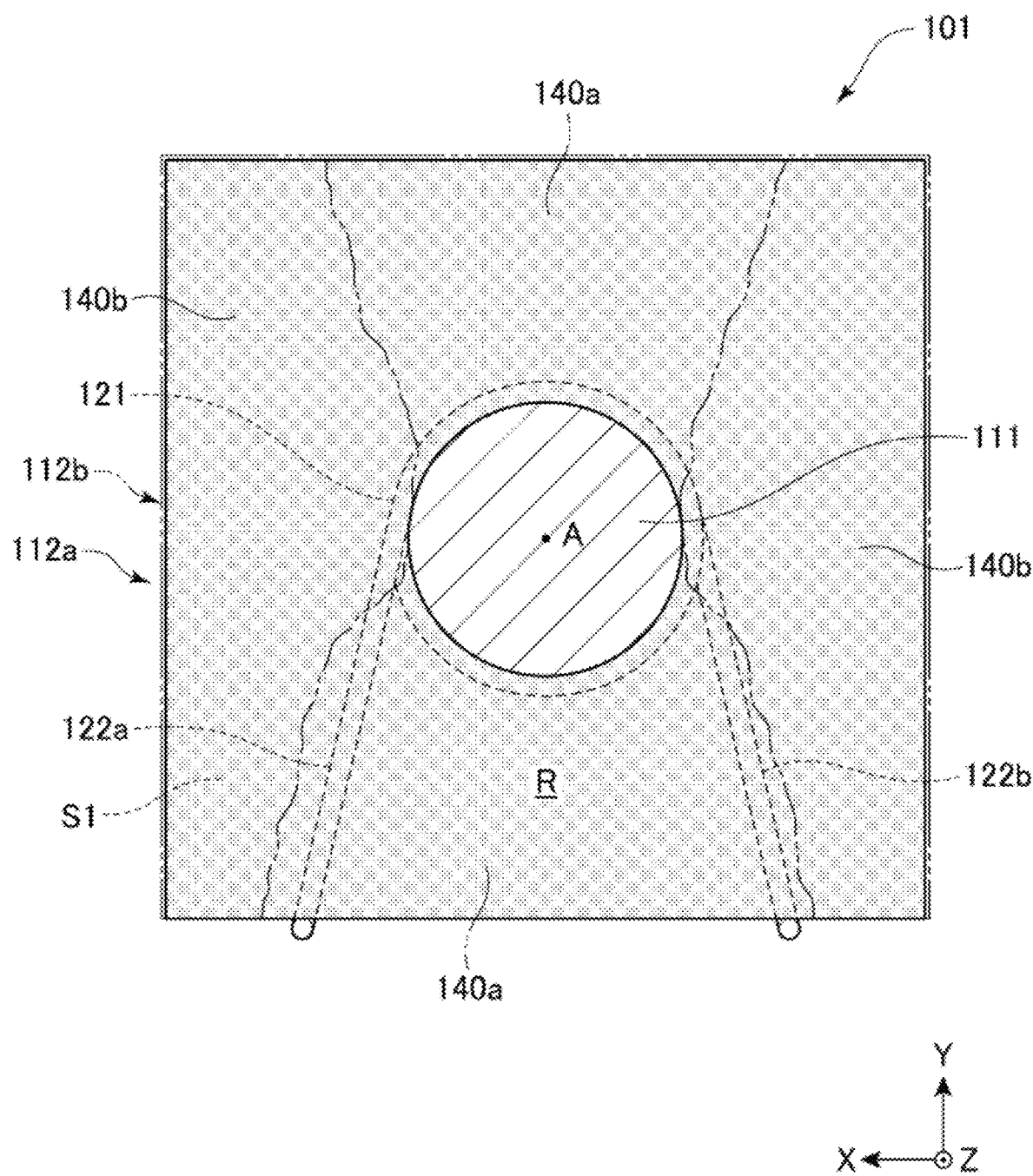
FIG. 8 is a top view for explaining the method of manufacturing the coil component according to the different embodiment.

Next, a coil component 101 according to a different embodiment of the present invention and a method of manufacturing the coil component 101 according to the different embodiment will be described with reference to FIGS. 7 and 8. FIGS. 7 and 8 are top views of the coil component 101 in the process of manufacturing, and a second flange portion 112b is illustrated by a two-dotted chain line for convenience of explanation. Detailed description of members in the coil component 101 that are common to those in the coil component 1 will be omitted. For example, since external electrodes included in the coil component 101 are configured similarly to the external electrodes 30a and 30b included in the coil component 1, the external electrodes will be described using the reference signs 30a and 30b in the description of the coil component 101 as well.

As illustrated in FIG. 8, an exterior portion 140 of the coil component 101 includes first exterior portions 140a and second exterior portions 140b. As illustrated in FIG. 7, the first exterior portions 140a are provided to cover at least a region R in a surface of a first flange portion 112a facing a second flange portion 112b (that is, an inner surface S1 of the first flange portion 112a) from the inner surface S1 of the first flange portion 112a to an inner surface S2 of a second flange portion 112b and expose a part of the wound portion 121 from the first exterior portions 140a. The region R is surrounded by a first lead-out portion 122a, a second lead-out portion 122, a wound portion 121, and one side of the first flange portion 112a to which the first lead-out portion 122a and the second lead-out portion 122b are led out when seen from the direction of the axial core A of the winding core portion 111. The second exterior portions 140b are provided to cover the part of the wound portion 121 exposed from the first exterior portions 140a. Although the inner surface S2 of the second flange portion 112b is not illustrated in FIGS. 7 and 8, the second flange portion 112b means a surface similar to the flange portion 12b illustrated in FIG. 2. The second exterior portions 140b may cover at least a part of the first exterior portions 140a. The first exterior portions 140a are provided to cover a part of the inner surface S1 of the first flange portion 112a and a part of the inner surface S2 of the second flange portion 112b, and sides of end surfaces (that is, the surfaces in the positive direction of the X axis and in the negative direction of the X axis) of the first exterior portions 140a are filled with the second exterior portions 140b. In this manner, the first exterior portions 140a and the second exterior portions 140b of the coil component 101 are alternately formed in the circumferential direction of the winding core portion 111.

It is only necessary for the wound portion 121 to be partially exposed from the first exterior portions 140a as long as the region R of the inner surface S1 of the first flange portion 112a is covered with the first exterior portions 140a, and the amount of the wound portion 121 exposed from the first exterior portions 140a is not particularly limited. Although the volume of the first exterior portions 140a is smaller than the volume of the second exterior portions 140b in the illustrated embodiment, the volume of the first exterior portions 140a may be larger than the volume of the second exterior portions 140b.

Next, a method of manufacturing the coil component 101 according to the different embodiment will be described. A drum core 110 including the winding core portion 111, the first flange portion 112a, and the second flange portion 112b is prepared first, and the external electrodes 30a and 30b are formed in the drum core 110 in the method of manufacturing the coil component 101 as well. Next, a conductive wire 120 is wound around the winding core portion 111 a predetermined number of times, one end portion of the conductive wire 120 is connected to the external electrode 30a, and the other end portion of the conductive wire 120 is connected to the external electrode 30b, thereby forming the first lead-out portion 122a and the second lead-out portion 122b. Although the external electrodes 30a and 30b are not illustrated in FIGS. 7 and 8, the external electrodes 30a and 30b are configured and disposed similarly to the external electrodes 30a and 30b illustrated in FIG. 2.

Next, the exterior portion 140 covering the wound portion 121 of the conductive wire 120 is formed using a resin material including a filler made of a magnetic material. As illustrated in FIG. 7, a resin paste is applied to regions of the wound portion 121 in the positive direction of the Y axis and in the negative direction of the Y axis in the manufacturing method according to the different embodiment. The resin paste may include a filler made of a magnetic material. At this time, the application is performed such that the resin paste comes into contact with both the inner surface S1 of the first flange portion 112a and the inner surface S2 of the second flange portion 112b. The wound portion 121 is brought into a state in which the wound portion 121 is exposed from the resin paste in the regions in the positive direction of the X axis and in the positive direction of the Y axis. The thus applied resin paste is heated to cure the resin paste, thereby forming the first exterior portions 140a. The process of heating the resin paste constituting the first exterior portions 140a (first heating process) is performed by raising the temperature from the room temperature to 140° C. for five minutes and then keeping the temperature at 140° C. to 180° C. for five minutes, for example. The resin paste constituting the first exterior portions 140b may include a filler made of a magnetic material. It is only necessary for the first exterior portion to cover at least the region R in the surface of the first flange portion 112a facing the second flange portion 112b (that is, the inner surface S1 of the first flange portion 112a). The region R is surrounded by the first lead-out portion 122a, the second lead-out portion 122b, the wound portion 121, and one side of the first flange portion 112a to which the first lead-out portion 122a and the second lead-out portion 122b are led out when seen from the direction of the axial core A of the winding core portion 111, and it is only necessary for the first exterior portions 140a to include the resin paste applied at least to the region of the wound portion 121 in the negative direction of the Y axis.

Next, the resin paste is applied again to the regions of the wound portion 121 in the positive direction of the X axis and the negative direction of the X direction, is heated, and is then cured, thereby forming the second exterior portions 140b as illustrated in FIG. 8. The process of heating the resin paste constituting the second exterior portions 140b (second heating process) is performed for a longer time at a lower temperature raising rate as compared with the process of heating the resin paste constituting the first exterior portions 140a (first heating process). For example, the second heating process is performed by raising the temperature from the room temperature to 100° C. for sixty minutes or more and then keeping the temperature at 150° C. to 180° C. for thirty minutes. The resin paste constituting the second exterior portions 140b may include a filler made of a magnetic material. In a case in which no first exterior portions 140a are formed in the region of the wound portion on the positive side of the Y axis, the resin paste is applied to the part as well to form the second exterior portion 140b. In this manner, the first exterior portions 140a and the second exterior portions 140b are alternately formed in the circumferential direction of the winding core portion 111.

In a case in which the interval between the first flange portion 12a and the second flange portion 12b is narrow (equal to or less than 2 mm, for example), it is significantly difficult to execute a process of applying the resin paste of the first exterior portion 40a only on the side of the first flange portion 12a with the wound portion 21 on the positive side of the Z axis exposed as in the method of manufacturing the coil component 1. In such a case, it is possible to manufacture a coil component having advantages similar to those of the coil component 1 by using the aforementioned method of manufacturing the coil component 101 according to the different embodiment. In a case in which the interval between the first flange 112a and the second flange portion 112b is equal to or less than 1.5 mm or is further equal to or less than 1 mm, in particular, it is preferable to use the aforementioned manufacturing method according to the different embodiment.

Next, advantages of the coil components 1 and 101 according to the aforementioned embodiments will be described. The exterior portions 40 and 140 of the coil components 1 and 101 include the first exterior portions 40a and 140a and the second exterior portions 40b and 140b, the first exterior portions 40a and 140a cover the regions R surrounded by the first lead-out portions 22a and 122a, the second lead-out portions 22b and 122b, and the wound portions 21 and 121 in the surfaces of the first flange portions 12a and 112a facing the second flange portions 12b and 112b (that is, the inner surfaces S1 of the first flange portions 12a and 112a), and the second exterior portions 40b and 140b cover at least parts of the first exterior portions 40a and 140a and the wound portions 21 and 121 exposed from the first exterior portions 40a and 140a. Since parts of the wound portions 21 and 121 of the conductive wires 20 and 120 are exposed from the first exterior portions 40a and 140a, thermal expansion of air remaining in the resin does not occur by the air remaining in the gaps of the conductive wires 20 and 120 being released from the portions from which the wound portions 21 and 121 are exposed when the first exterior portions 40a and 140a are formed. Therefore, no defects such as voids or open pores are formed in the first exterior portions 40a and 140a. Since such first exterior portions 40a and 140a with no defects cover the regions which a flux easily enters at the time of mounting, namely the regions R surrounded by the first lead-out portions 22a and 122a, the second lead-out portions 22b and 122b, the wound portions 21 and 121, and the sides of the first flange portions 12a and 112a to which the first lead-out portions 22a and 122a and the second lead-out portions 22b and 122b are led out when seen from the direction of the axial core A of the winding core portions 21 and 121, it is possible to curb entrance of the flux used to bond the conductive wire 20 to the inside of the coil component 1 when the external electrodes 30a and 30b are formed and to curb entrance of the flux to the inside of the coil component 1 at the time of mounting on a circuit board. Also, there is no need to consider defects due to thermal expansion of air remaining in the resin, and it is possible to raise the temperature at a high temperature raising rate in the first heating process and to improve producing ability.

As described above, the first exterior portions 40a and 140a are configured not to include any voids in the coil component 1. The first exterior portions 40a and 140a not including any voids means that porosities in the first exterior portions 40a and 140a are less than 1%. The porosities in the first exterior portions 40a and 140a means proportions of void spaces occupying predetermined regions in sections of the first exterior portions 40a and 140a. The areas of the void spaces in the sections of the first exterior portions 40a and 140a are obtained as follows, for example. First, the first exterior portions 40a and 140a are cut along the thickness direction thereof (the T-axis direction, for example) to expose sections, and the sections are imaged by a scanning electron microscope (SEM) at a predetermined magnification (a magnification within a range of 2000 times to 5000 times, for example) to obtain SEM images including parts of the sections of the first exterior portions 40a and 140a as fields of view for observation. The captured SEM image is then subjected to image processing such as binarization, so that voids and no-void regions are distinguished from each other and the area of the regions classified as the voids is calculated. The binarization may be replaced with multi-value processing. Then, the thus obtained areas of void spaces in the fields of view for observation are added up, and the total areas of the void spaces in the fields of view for observation are divided by areas of the fields of view for observation, thereby calculating the porosities. The porosities represented as percentage are represented by the following equation.

Porosity (%)=(total area of void spaces in fields of view for observation/total area of fields of view for observation)×100

Also, the material constituting the first exterior portions 40a and 140a and the material constituting the second exterior portions 40b and 140b may be a material of the same component in one embodiment of the present invention. It is thus possible to enhance adhesiveness between the first exterior portions 40a and 140a and the second exterior portion 40b and 140b.

Also, the resin used for the exterior portions 40 and 140 can include a filler made of a magnetic material in one embodiment of the present invention. The interference between the filler and the resin included in the exterior portions 40 and 140 is likely to keep air, peeling is likely to occur at the interference between the filler and the resin when the resin of the exterior portions 40 and 140 are cured as a result, and the peeling at the interference may cause voids. In a case in which the filler is made of a magnetic material, mutual wettability of the resin and the filler is low, and the peeling at the interference is thus likely to occur. Since the exterior portions include the first exterior portions 40a and 140a and the second exterior portions 40b and 140b in the embodiments of the present invention, it is possible to discharge the air kept at the interference between the filler and the resin in the first heating when the first exterior portions 40a and 140a are produced and thereby to curb occurrence of voids in the exterior portions 40 and 140. Therefore, it is possible to prevent entrance of the flux even if the resin of the exterior portions 40 and 140 includes a filler, particularly, a filler made of a magnetic material. Although the filler is not limited to a magnetic material, a magnetic material is preferably used to enhance magnetic properties.

In one embodiment of the present invention, the process of forming the first exterior portions 40a and 140a may include a first heating process of curing the resin material, the process of forming the second exterior portions 40b and 140b may include a second heating process of curing the resin material, and the temperature may be raised at a lower rate in the second heating process than in the first heating process. It is possible to gradually gasify and remove moisture contained in the resin material constituting the second exterior portions 40b and 140b by raising the temperature at a lower rate in the second heating process than in the first heating process and thereby to curb formation of voids in the second exterior portions 40b and 140b. Therefore, the flux used to bond the conductive wires 20 and 120 is unlikely to enter the inside of the coil component 1 when the external electrodes 30a and 30b are formed, and the flux used to mount the coil components 1 and 101 on circuit boards is unlikely to enter the inside of the coil components 1 and 101. Also, it is possible to fill the defects in the first exterior portions 40a and 140a with the second exterior portions 40b and 140b even if defects such as voids are formed in the first exterior portions 40a and 140a and thereby to more reliably curb entrance of the flux to the inside of the coil components 1 and 101.

Also, in one embodiment of the present invention, the viscosity of the material constituting the first exterior portions 40a and 140a may be lower than the viscosity of the material constituting the second exterior portions 40b and 140b. Since the material constituting the first exterior portions 40a and 140a is likely to enter the gaps of the conductive wires 20 and 120 when the first exterior portions 40a and 140a are formed by configuring the first exterior portions 40a and 140a using a material with a lower viscosity, it is possible to reduce the amount of air contained in sites of the first exterior portions 40a and 140a disposed in the gaps of the conductive wires 20 and 120, to facilitate release of the remaining air through heating, and thereby to more reliably prevent formation of defects such as voids and open pores in the first exterior portions 40a and 140a.

The dimensions, materials, and arrangements of the constituent elements described herein are not limited to those explicitly described for the embodiments, and these constituent elements can be modified to have any dimensions, materials, and arrangements within the scope of the present invention. Furthermore, constituent elements not explicitly described herein can also be added to the described embodiments, and it is also possible to omit some of the constituent elements described for the embodiments.

What is claimed is:

1. A coil component comprising:
   a drum core including a winding core portion, a first flange portion provided at one end of the winding core portion, and a second flange portion provided at the other end of the winding core portion;
   a conductive wire including a wound portion wound around the winding core portion and a first lead-out portion and a second lead-out portion led out from the winding core portion to the first flange portion;
   a pair of external electrodes provided at the first flange portion, each external electrode of the pair of external electrodes being electrically connected to associated one of end portions of the conductive wire; and
   an exterior portion including a first exterior portion and a second exterior portion and made of a resin material, the first exterior portion being provided to cover a region in a surface of the first flange portion facing the second flange portion and expose a part of the wound portion, the region being surrounded by the first lead-out portion, the second lead-out portion, the wound portion, and one side of the first flange portion to which the first lead-out portion and the second lead-out portion are led out when seen from an axial direction of the winding core portion, the second exterior portion covering at least a part of the first exterior portion and the part of the wound portion exposed from the first exterior portion.

2. The coil component according to claim 1, wherein the first exterior portion and the second exterior portion are made of a resin material containing a same component.

3. The coil component according to claim 1, wherein the conductive wire and the external electrodes are electrically connected through solder-bonding.

4. The coil component according to claim 1, wherein a volume of the first exterior portion is smaller than a volume of the second exterior portion.

5. The coil component according to claim 1, wherein a volume of the first exterior portion is larger than a volume of the second exterior portion.

6. The coil component according to claim 1, wherein the resin material includes a filler made of a magnetic material.

7. The coil component according to claim 6, wherein the magnetic material is a metal or a ferrite.

8. The coil component according to claim 1, wherein the first exterior portion includes no voids.

9. A circuit board comprising the coil component of claim 1.

10. An electronic device comprising the circuit board of claim 9.

11. A method of manufacturing a coil component comprising:
    preparing a drum core including a winding core portion, a first flange portion provided at one end of the winding core portion, and a second flange portion provided at the other end of the winding core portion;
    winding a conductive wire around the drum core to form a wound portion wound around the winding core portion and a first lead-out portion and a second lead-out portion led out from the winding core portion to the first flange portion;
    bonding and securing both end portions of the conductive wire to the first flange portion to form a pair of external electrodes; and
    forming an exterior portion covering the wound portion of the conductive wire using a resin material,
    wherein the forming of the exterior portion includes:
        forming a first exterior portion to cover a region in a surface of the first flange portion facing the second flange portion and expose a part of the wound portion, the region being surrounded by the first lead-out portion, the second lead-out portion, the wound portion, and one side of the first flange portion to which the first lead-out portion and the second lead-out portion are led out when seen from an axial direction of the winding core portion; and
        forming a second exterior portion that covers at least a part of the first exterior portion and the part of the wound portion exposed from the first exterior portion.

12. The method of manufacturing a coil component according to claim 11,
    wherein the forming of the first exterior portion includes a first heating process of curing the resin material, wherein the forming of the second exterior portion includes a second heating process of curing the resin material, and wherein a temperature is raised at a lower rate in the second heating process than in the first heating process.

13. The method of manufacturing a coil component according to claim 11, wherein a viscosity of the resin material constituting the first exterior portion is lower than a viscosity of the resin material constituting the second exterior portion.

* * * * *